(12) United States Patent
Sakamoto

(10) Patent No.: US 11,906,592 B2
(45) Date of Patent: Feb. 20, 2024

(54) METHOD OF PRODUCING ALL-SOLID-STATE BATTERY

(71) Applicant: Toyota Jidosha Kabushiki Kaisha, Toyota (JP)

(72) Inventor: Ryuto Sakamoto, Okazaki (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 243 days.

(21) Appl. No.: 17/376,734

(22) Filed: Jul. 15, 2021

(65) Prior Publication Data

US 2022/0018908 A1    Jan. 20, 2022

(30) Foreign Application Priority Data

Jul. 20, 2020  (JP) ................. 2020-123631

(51) Int. Cl.
| | |
|---|---|
| H01M 10/0585 | (2010.01) |
| G01R 31/385 | (2019.01) |
| G01R 31/389 | (2019.01) |
| G01R 31/14 | (2006.01) |

(52) U.S. Cl.
CPC ......... *G01R 31/3865* (2019.01); *G01R 31/14* (2013.01); *G01R 31/389* (2019.01); *H01M 10/0585* (2013.01)

(58) Field of Classification Search
CPC ............... G01R 31/1227; G01R 31/14; G01R 31/3865; G01R 31/389; H01M 10/049; H01M 10/0562; H01M 10/0585; H01M 10/4285; H01M 2300/0068; Y02E 60/10; Y02P 70/50

See application file for complete search history.

(56) References Cited

U.S. PATENT DOCUMENTS

| | | | | |
|---|---|---|---|---|
| 2016/0049258 | A1* | 2/2016 | Kojima | H01G 4/008 29/25.42 |
| 2020/0350523 | A1* | 11/2020 | Weinmann | H01M 50/211 |

FOREIGN PATENT DOCUMENTS

| | | | | |
|---|---|---|---|---|
| JP | 2000195565 A | * | 7/2000 | ......... H01M 10/00 |
| JP | 2005217087 A | * | 8/2005 | ......... G02F 1/1343 |
| JP | 2009-211920 A | | 9/2009 | |
| JP | 2015-008073 A | | 1/2015 | |

OTHER PUBLICATIONS

Machine translation JP2000195565A (Year: 2000).*
Machine translation JP2005217087A (Year: 2005).*

* cited by examiner

*Primary Examiner* — Victoria H Lynch
(74) *Attorney, Agent, or Firm* — Dinsmore & Shohl LLP

(57) ABSTRACT

A method of producing an all-solid-state battery includes forming an insulating layer-attached stack unit including an insulating layer and a stack unit that includes a positive electrode layer, a solid electrolyte layer and a negative electrode layer; performing a dielectric breakdown test on the insulating layer included in the insulating layer-attached stack unit, and determining that the insulating layer-attached stack unit is a non-defective product if no dielectric breakdown is present; forming an electrode member having both ends by disposing the two insulating layer-attached stack units at the both ends, the insulating layer-attached stack unit being determined to be a non-defective product; accommodating the electrode member in a case; and assembling a restraint member to the outside of the case to produce an all-solid-state battery.

4 Claims, 8 Drawing Sheets

NUMBER OF ELECTRODE MEMBERS

METHOD OF PRODUCING ALL-SOLID-STATE BATTERY

CROSS REFERENCE TO RELATED APPLICATIONS

This nonprovisional application claims priority to Japanese Patent Application No. 2020-123631 filed on Jul. 20, 2020 with the Japan Patent Office, the entire contents of which are hereby incorporated by reference.

BACKGROUND

Field

The present disclosure relates to a method of producing an all-solid-state battery.

Description of the Background Art

Japanese Patent Laying-Open No. 2009-211920 discloses an all-solid-state lithium secondary battery and a method of producing the same at a low rate of defective products.

Further, Japanese Patent Application Laying-Open No. 2015-008073 discloses a method of producing an all-solid-state battery. The method of producing an all-solid-state battery includes: a step of preparing a negative electrode layer which includes a negative electrode active material layer and a solid electrolyte layer; a step of preparing a positive electrode layer which includes a positive electrode active material layer and a solid electrolyte layer; and a step of preparing a stack unit by stacking the positive electrode layer and the negative electrode layer in such a manner that the solid electrolyte layer of the positive electrode layer and the solid electrolyte layer of the negative electrode layer are in contact with each other, and further includes a step of performing an insulation inspection on the negative electrode layer and the positive electrode layer prior to the stacking step, and a step of performing a short circuit inspection on a plurality of stack units stacked after the stacking step.

SUMMARY

In the all-solid-state battery disclosed in Japanese Patent Application Laying-Open No. 2015-008073, the insulation inspection is performed on each negative electrode layer and each positive electrode layer, it is possible to exclude a negative electrode layer and/or a positive electrode layer which is determined to be not insulative, which makes it possible to stack those negative electrode layers and positive electrode layers which are hardly short-circuited in the subsequent stacking step so as to improve the performance of the all-solid-state battery.

However, since the insulation inspection is only performed on the plurality of stack units as a whole after the stacking step but not on each stack unit, there is a possibility that the plurality of stack units as a whole may be defective.

An object of the present disclosure is to reduce a rate of defective products by effectively utilizing a stack unit that includes a positive electrode layer, a solid electrolyte layer and a negative electrode layer in producing an all-solid-state battery including a plurality of insulating layer-attached stack units, each of which includes an insulating layer and the stack unit.

Hereinafter, the technical configuration and effects of the present disclosure will be described. It should be noted that the action mechanism according to the present disclosure includes presumption. Whether the action mechanism is correct or not does not limit the scope of claims.

[1] A method of producing an all-solid-state battery includes the following steps (A) to (E):

(A) forming an insulating layer-attached stack unit including an insulating layer and a stack unit that includes a positive electrode layer, a solid electrolyte layer and a negative electrode layer;

(B) performing a dielectric breakdown test on the insulating layer included in the insulating layer-attached stack unit, and determining that the insulating layer-attached stack unit is a non-defective product if no dielectric breakdown is present;

(C) forming an electrode member having both ends by disposing the two insulating layer-attached stack units at the both ends, the insulating layer-attached stack unit being determined to be a non-defective product;

(D) accommodating the electrode member in a case; and (E) assembling a restraint member to the outside of the case to produce the all-solid-state battery.

In the dielectric breakdown test, the presence or absence of dielectric breakdown is confirmed at a predetermined test temperature with a predetermined test pressure applied to the insulating layer.

Under the test temperature and the test pressure of the breakdown test, the insulating layer has a property that the thickness thereof gradually approaches a constant value.

The insulating layer is disposed between the stack unit and the case. The case includes a metal material.

FIG. 1 is a schematic cross-sectional view illustrating a dielectric breakdown test performed on an insulating layer included in a stack unit according to the present embodiment.

In the present disclosure, after forming an insulating layer-attached stack unit including an insulating layer and a stack unit that includes a positive electrode layer, a solid electrolyte layer and a negative electrode layer, a dielectric breakdown test is performed on the insulating layer of each insulating layer-attached stack unit, and if no dielectric breakdown is present, the stack unit is determined to be a non-defective product. Thus, even a single insulating layer-attached stack unit is detected as being defective, the entire stack unit is prevented from becoming a defective product.

In addition, it is assumed that a foreign matter (for example, a metal piece or the like) may enter between the case and the stack unit or between the positive electrode collector foil and the positive electrode composite material layer during the process of producing a battery. If an external force is applied to the battery when the foreign matter is present, the foreign matter may pierce the insulating layer, which may cause a short circuit between the stack unit and the case.

In the present disclosure, the rate of defective products may be reduced by effectively utilizing a stack unit that includes a positive electrode layer, a solid electrolyte layer and a negative electrode layer in producing an all-solid-state battery including a plurality of insulating layer-attached stack units, each of which includes an insulating layer and the stack unit.

[2] In the all-solid-state battery according to [1], the restraint member applies to the insulating layer a pressure that is less than the test pressure in the dielectric breakdown test, and the all-solid-state battery may be used in an environment with a temperature that is equal to or lower than the test temperature in the dielectric breakdown test.

In the present disclosure, since the dielectric breakdown test is performed by compressing the thickness of the insulating layer to the actual thickness during practical use under an environment severer than that during practical use, it is possible to obtain a stack unit which is very unlikely to encounter a short circuit during practical use, which makes it possible to reduce the possibility of short circuits during practical use.

[3] In the all-solid-state battery according to [1] or [2], the electrode member having the both ends further includes one or more stack units disposed between the two insulating layer-attached stack units at the both ends, and the insulating layers may be disposed between adjacent stack units.

The foregoing and other objects, features, aspects and advantages of the present disclosure will become more apparent from the following detailed description of the present disclosure when taken in conjunction with the accompanying drawings.

DETAILED DESCRIPTION

Figure 1:
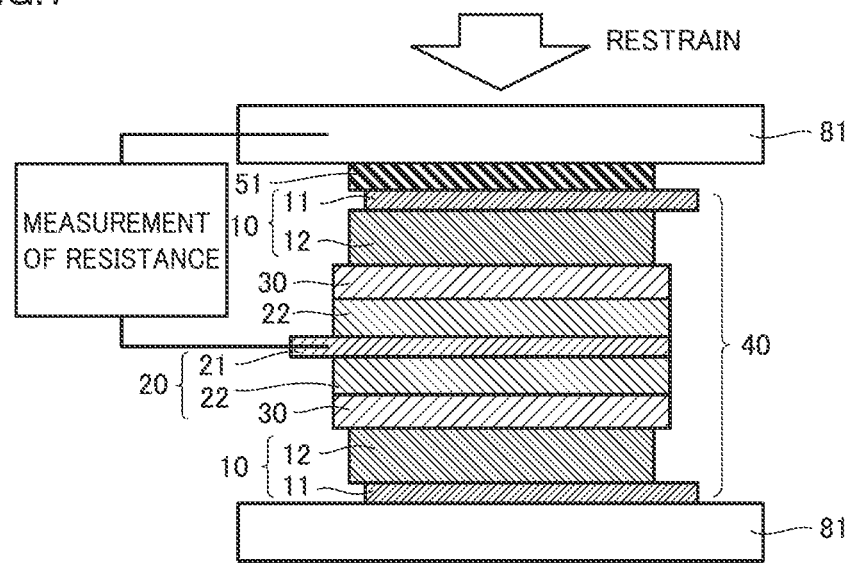
FIG. 1 is a schematic cross-sectional view illustrating a dielectric breakdown test performed on an insulating layer included in an insulating layer-attached stack unit according to the present embodiment.

Hereinafter, an embodiment of the present disclosure (which may be referred to as "the present embodiment" hereinafter) will be described. However, the following description does not limit the scope of the claims.

In the present disclosure, for example, an expression such as "0.1 parts by mass to 10 parts by mass" or the like indicates a range that includes both boundary values unless otherwise specified. For example, "0.1 parts by mass to 10 parts by mass" indicates a range of "0.1 parts by mass or more and 10 parts by mass or less".

<Method of Producing all-Solid-State Battery>

The method of producing an all-solid-state battery according to the present embodiment includes "(A) formation of a stack unit", "(B) determination", "(C) formation of an electrode member", "(D) accommodation", and "(E) assembly of a restraint member".

<<(A) Formation of Stack Unit>>

The method of producing an all-solid-state battery 90 according to the present embodiment includes forming an insulating layer-attached stack unit including an insulating layer 51 and a stack unit 40 that includes a positive electrode layer 10, a solid electrolyte layer 30 and a negative electrode layer 20.

Figure 2:
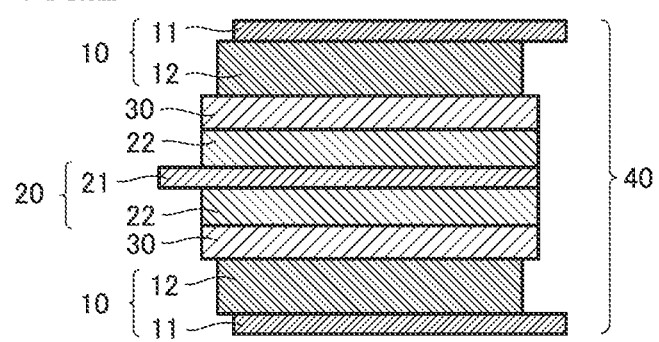
FIG. 2 is a schematic cross-sectional view illustrating a stack unit according to the present embodiment.

FIG. 2 is a schematic cross-sectional view illustrating the stack unit 40 according to the present embodiment.

The stack unit 40 includes a positive electrode layer 10, a solid electrolyte layer 30, and a negative electrode layer 20. The solid electrolyte layer 30 is referred to as a separator. The solid electrolyte layer 30 separates the positive electrode layer 10 and the negative electrode layer 20. The positive electrode layer 10 is connected to a positive electrode terminal (not shown). The negative electrode layer 20 is connected to a negative electrode terminal (not shown).

The stack unit 40 may be formed by any method. For example, the positive electrode layer 10, the solid electrolyte layer 30 and the negative electrode layer 20 each may be formed by powder molding. For example, the positive electrode layer 10, the solid electrolyte layer 30 and the negative electrode layer 20 each may be formed by slurry coating. For example, the positive electrode layer 10, the solid electrolyte layer 30 and the negative electrode layer 20 may be integrated by compression molding.

The stack unit 40 is a stacked body. The stack unit 40 is formed by stacking the positive electrode layer 10, the solid electrolyte layer 30 and the negative electrode layer 20. The stack unit 40 may have any stacking structure as long as the stack unit 40 includes one or more positive electrode layers 10, one or more solid electrolyte layers 30 and one or more negative electrode layers 20. For example, the stack unit 40 may be formed by stacking the positive electrode layer 10, the solid electrolyte layer 30, the negative electrode layer 20, the solid electrolyte layer 30, and the positive electrode layer 10 in this order.

The positive electrode layer 10 is disposed in close contact with the solid electrolyte layer 30. The positive electrode layer 10 includes a positive electrode collector foil 11 and a positive electrode composite material layer 12. The positive electrode collector foil 11 may be, for example, an aluminum (Al) foil or the like.

The positive electrode composite material layer 12 includes at least a positive electrode active material. For example, the positive electrode composite material layer 12 may be substantially made of a positive electrode active material. In addition to the positive electrode active material, the positive electrode composite material layer 12 may include, for example, a solid electrolyte, a conductive material and a binder. The positive electrode active material may include, for example, at least one selected from the group consisting of lithium cobalt oxide, lithium nickel oxide, lithium manganese oxide, lithium nickel cobalt manganese oxide (such as $Li_{1.15}Ni_{1/3}Co_{1/3}Mn_{1/3}O_2$), lithium nickel cobalt aluminate, and lithium iron phosphate. The positive electrode active material may be subjected to a surface treatment. A buffer layer may be formed on the surface of the positive electrode active material by the surface treatment. The buffer layer may include, for example, lithium niobium oxide ($LiNbO_3$) or the like. The solid electrolyte may include, for example, sulfide solid electrolyte (such as $LiBr-LiI-(Li_2S-P_2S_5)$) or the like. The conductive material may include, for example, a conductive carbon material (such as vapor grown carbon fiber (VGCF)) or the like. The binder may include, for example, polyvinylidene fluoride (PVdF) or the like.

The solid electrolyte layer 30 is disposed between the positive electrode layer 10 and the negative electrode layer 20. The solid electrolyte layer 30 physically separates the positive electrode layer 10 and the negative electrode layer 20. The solid electrolyte layer 30 blocks electron conduction between the positive electrode layer 10 and the negative electrode layer 20. The solid electrolyte layer 30 forms an ion conduction path between the positive electrode layer 10 and the negative electrode layer 20.

The solid electrolyte layer 30 includes at least a solid electrolyte. For example, the solid electrolyte layer 30 may be substantially made of a solid electrolyte. In addition to the solid electrolyte, the solid electrolyte layer 30 may include, for example, a binder or the like. The solid electrolyte may include, for example, a sulfide solid electrolyte (such as LiBr—LiI-($Li_2S$—$P_2S_5$)) or the like. The binder may include, for example, butadiene rubber (BR) or the like.

The negative electrode layer 20 is disposed in close contact with the solid electrolyte layer 30. The negative electrode layer 20 includes a negative electrode collector foil 21 and a negative electrode composite material layer 22. The negative electrode collector foil 21 may be, for example, a copper (Cu) foil, a nickel (Ni) foil, or the like.

The negative electrode composite material layer 22 includes at least a negative electrode active material. For example, the negative electrode composite material layer 22 may be substantially made of a negative electrode active material. In addition to the negative electrode active material, the negative electrode composite material layer 22 may include, for example, a solid electrolyte, a conductive material, and a binder. The negative electrode active material may include, for example, at least one selected from the group consisting of graphite, soft carbon, hard carbon, silicon, silicon oxide, silicon-based alloy, tin, tin oxide, tin-based alloy, and lithium titanium oxide ($Li_4Ti_5O_{12}$). The solid electrolyte may include, for example, sulfide solid electrolyte (such as LiBr—LiI-($Li_2S$—$P_2S_5$)) or the like. The conductive material may include, for example, a conductive carbon material (such as VGCF) or the like. The binder may include, for example, PVdF or the like.

The insulating layer 51 is disposed between the stack unit 40 (the positive electrode layer 10) and a case 70. The insulating layer 52 is disposed between adjacent stack units 40. The insulating layer 51 and the insulating layer 52 are integrated with the positive electrode collector foil 11. The insulating layer 51 and the insulating layer 52 may be formed on the surface of the positive electrode collector foil 11, for example. The insulating layer 51 and the insulating layer 52 may be formed to entirely cover one surface of the positive electrode collector foil 11, for example. The insulating layer 51 and the insulating layer 52 may be formed to partially cover one surface of the positive electrode collector foil 11, for example.

The insulating layer 51 contributes to dielectric resistance between the positive electrode collector foil 11 and the case 70. The insulating layer 51 and the insulating layer 52 include an insulating material. The insulating material used in the present embodiment has a volume resistivity of $1\times10^5$ Ω·cm or more at 25° C.

The insulating layer 51 and the insulating layer 52 may have a thickness of, for example, 0.1 μm to 100 μm. The insulating layer 51 and the insulating layer 52 may have a thickness of, for example, 1 μm to 10 μm.

The insulating layer 51 and the insulating layer 52 may be substantially made of an insulating material. In addition to the insulating material, the insulating layer 51 and the insulating layer 52 may include, for example, a binder. The volume fraction of the insulating material in the insulating layer 51 and in the insulating layer 52 may be, for example, 50% to 100%. The volume fraction of the insulating material in the insulating layer 51 and in the insulating layer 52 may be, for example, 80% to 100%. The volume fraction of the insulating material in the insulating layer 51 and in the insulating layer 52 may be, for example, 60% to 100%.

The insulating material is not particularly limited as long as it is a saturable material (in other words, the thickness thereof gradually approaches a constant value under the test temperature and the test pressure of the dielectric breakdown test). The insulating material may include, for example, at least one selected from the group consisting of polypropylene (PP), diamond-like carbon (DLC), alumina, anodized aluminum, silicon carbide (SiC), and boron nitride (BN). In some embodiments, the insulating material is PP.

The insulating layer 51 or the insulating layer 52 may be formed on the surface of the positive electrode collector foil 11 by, for example, chemical vapor deposition (CVD) or physical vapor deposition (PVD). For example, DLC, a ceramic material or the like may be deposited on the surface of the positive electrode collector foil 11 by CVD or the like. The insulating layer 51 or the insulating layer 52 formed by CVD or the like may be integrated with the positive electrode collector foil 11.

<<(B) Determination>>

The method of producing an all-solid-state battery 90 according to the present embodiment includes performing a dielectric breakdown test on the insulating layer 51 included in the insulating layer-attached stack unit, and determining that the insulating layer-attached stack unit is a non-defective product if no dielectric breakdown is present.

FIG. 1 is a schematic cross-sectional view illustrating a dielectric breakdown test performed on the insulating layer 51 included in the insulating layer-attached stack unit according to the present embodiment. In the present disclosure, the "insulation breakdown test" is a test for confirming whether or not the insulating layer 51 is insulative, and is carried out in accordance with JIS C2110-1: 2016, "Solid electrical insulating materials-Test methods for electric strength, Part 1: Tests at power frequencies". By performing the dielectric breakdown test, it is possible to exclude such an insulating layer-attached stack unit that is determined to be not insulative.

In the dielectric breakdown test, the presence or absence of dielectric breakdown is confirmed at a predetermined test temperature with a predetermined test pressure applied to the insulating layer 51. The test temperature and the test pressure in the dielectric breakdown test are as follows.

Figure 7:
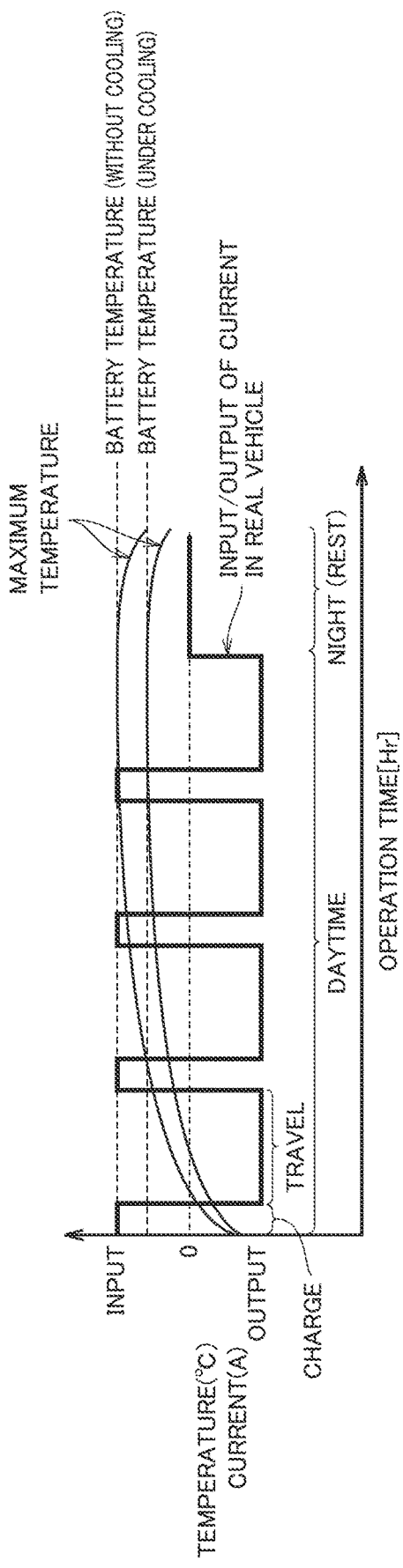
FIG. 7 is a diagram illustrating a maximum operation temperature of an electrode member according to the present embodiment.

FIG. 7 is a diagram illustrating a maximum operation temperature of the electrode member 60 according to the present embodiment. In some embodiments, the test temperature is equal to or higher than the operation maximum temperature of the electrode member 60. The maximum operation temperature is measured in advance. In other words, a thermocouple is attached to a positive electrode, a negative electrode terminal and a central portion of the electrode member 60, respectively, the temperature of the central portion is measured by repeating the input and output of current, and the measured maximum temperature is defined as the maximum operation temperature.

Figure 8:
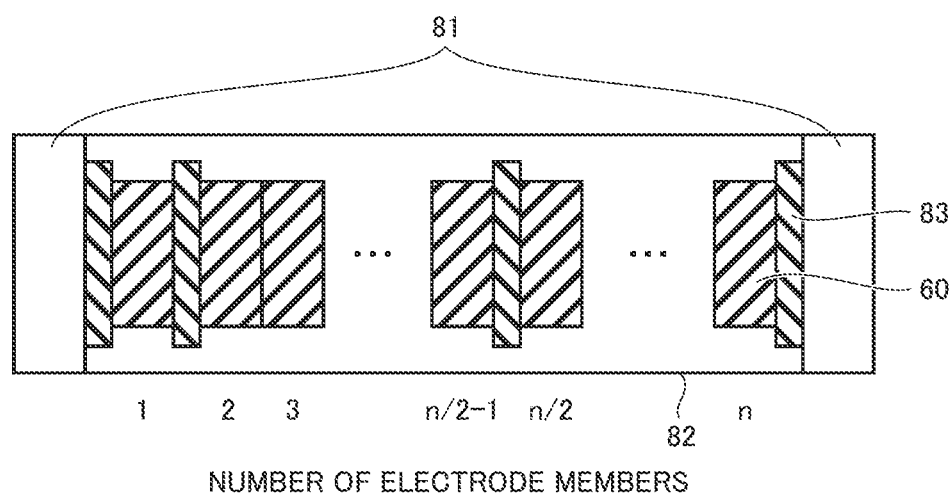
FIG. 8 is a schematic cross-sectional view illustrating that the electrode member according to the present embodiment is restrained with a tactile sensor.

FIG. 8 is a schematic cross-sectional view illustrating that the electrode member 60 according to the present embodiment is restrained with a tactile sensor 83. After the electrode member 60 is restrained with the tactile sensor 83 by using a pair of restraint plates 81 and a restraint band 82 during packing, a change in pressure is measured by repeating charging and discharging similar to that in FIG. 7, and the maximum pressure measured by the tactile sensor 83 is defined as the maximum restraint pressure. In some embodiments, the test pressure is equal to or higher than the maximum restraint pressure.

Under the test temperature and the test pressure of the dielectric breakdown test, the insulating layer 51 has a property that the thickness thereof gradually approaches a constant value.

Figure 5:
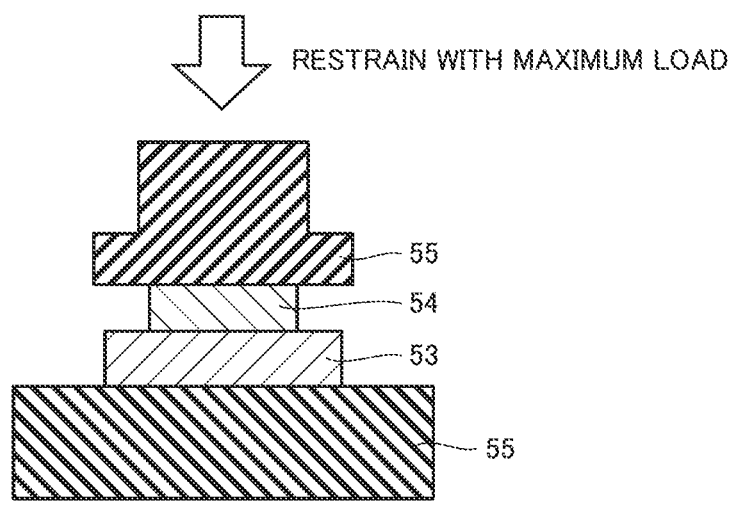
FIG. 5 is a schematic cross-sectional view illustrating that a pressure is applied to a positive electrode collector foil integrated with the insulating layer according to the present embodiment.
Figure 6:
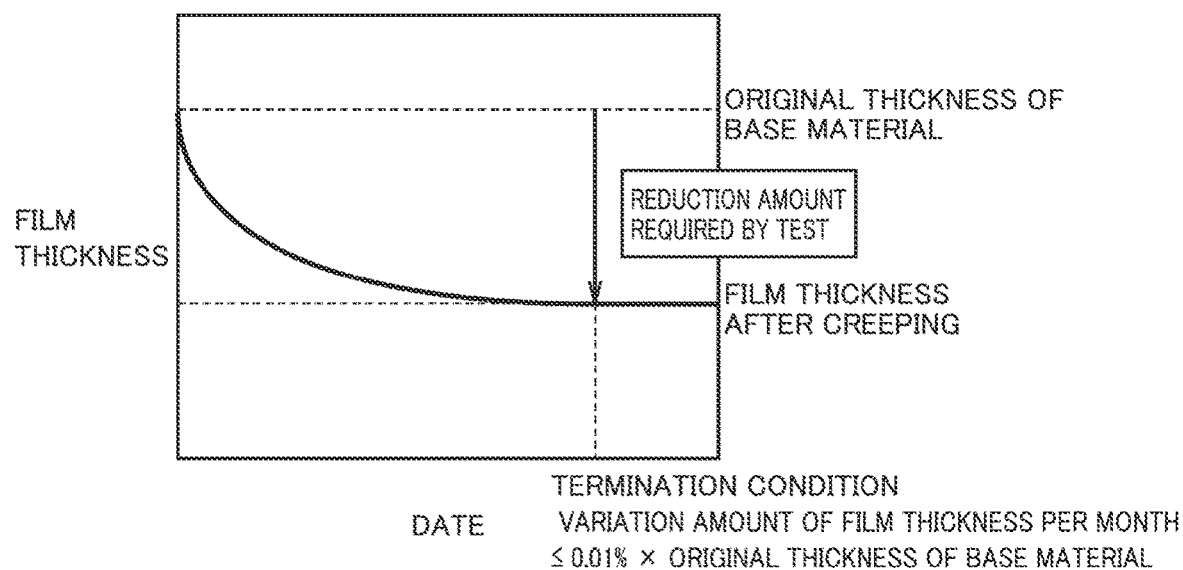
FIG. 6 is a diagram illustrating a maximum reduction amount of film thickness calculated based on a creep amount of the positive electrode collector foil integrated with the insulating layer according to the present embodiment.

FIG. 5 is a schematic cross-sectional view illustrating that a pressure is applied to a collector foil (insulating layer-integrated collector foil 53) which is obtained by integrating the insulating layer 51 and the positive electrode collector foil 11 according to the present embodiment, and FIG. 6 is a diagram illustrating a reduction amount of film thickness calculated based on a creep amount of the insulating layer-integrated collector foil 53 according to the present embodiment. Creep refers to a phenomenon in which strain (deformation) increases over time when a stress is continuously applied to an object, and the creep amount refers to an amount of strain.

The maximum reduction amount of film thickness is calculated as follows. First, the insulating layer-integrated collector foil 53 was cut into a size of 30.0 mm×30.0 mm, a metal block 54 having a size of 20.0 mm×20.0 mm was stacked thereon, and the insulating layer-integrated collector foil 53 and the metal block 54 were sandwiched between a pair of compression jigs 55, and restrained with an autograph under a maximum restraint pressure so as to apply a constant pressure to both surfaces. Thereafter, the insulating layer-integrated collector foil 53 was heated to a maximum temperature, and a creep amount thereof was measured periodically. A time when the measured creep amount (stroke amount) per month was 0.01% or less of the original thickness of base material is set as a saturation time, the maximum reduction amount of film thickness was calculated based on the creep amount at the saturation time. In some embodiments, the test pressure of the dielectric breakdown test is set so as to cause the deformation of a maximum reduction amount of film thickness thus calculated at the time of inspection.

<<(C) Formation of Electrode Member>>

The method of producing an all-solid-state battery 90 according to the present embodiment includes forming the electrode member 60 having both ends by disposing the two insulating layer-attached stack units at the both ends, the insulating layer-attached stack unit being determined to be a non-defective product.

In the case of producing an all-solid-state battery 90 in which a plurality of cells are electrically connected, the electrode member 60 may be formed by any known method by stacking a plurality of insulating layer-attached stack units, each of which is determined to be a non-defective product in step (B).

Figure 3:
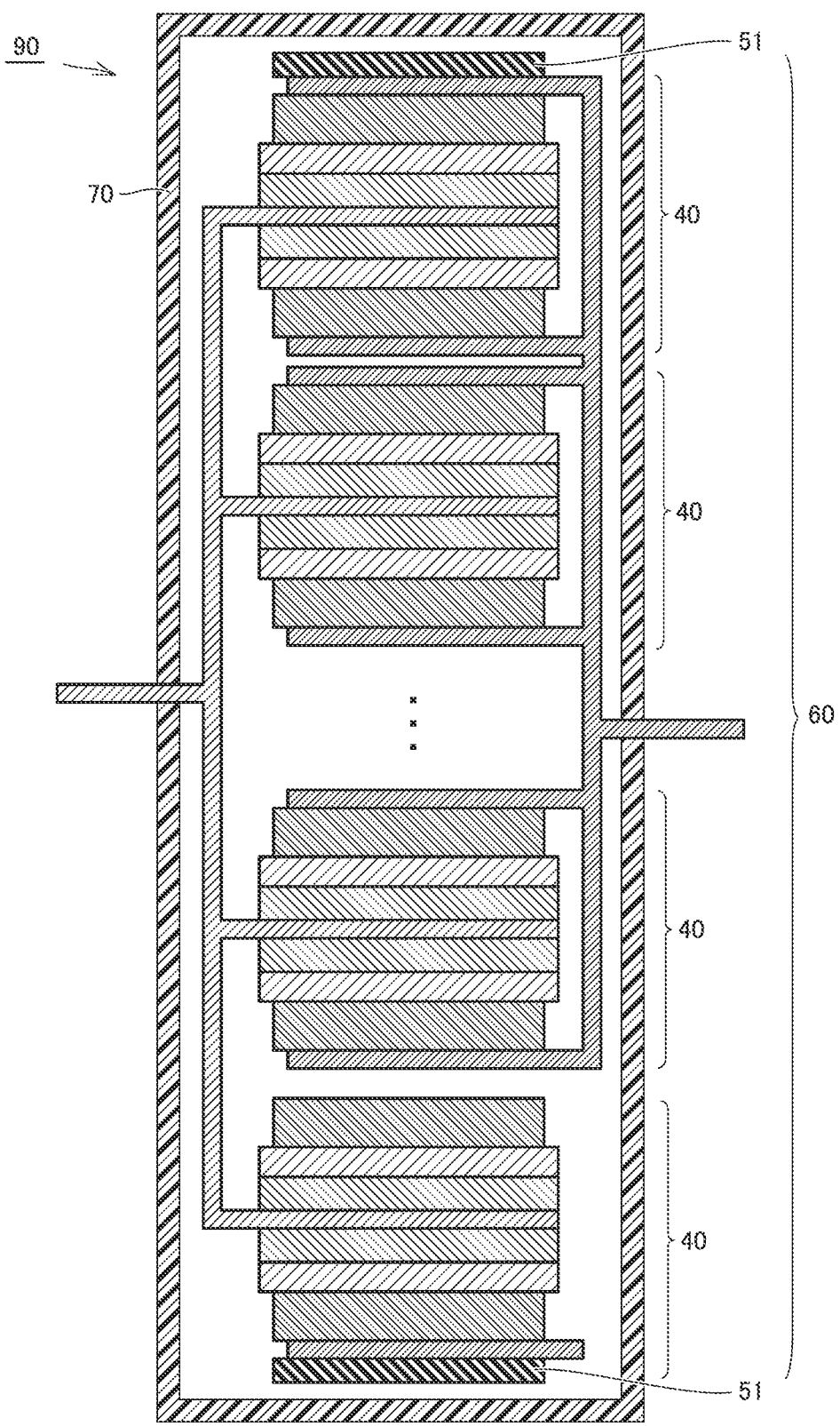
FIG. 3 is a schematic cross-sectional view illustrating an all-solid-state battery in which two insulating layer-attached stack units according to the present embodiment are disposed at both ends, and one or more stack units are sandwiched therebetween.
Figure 4:
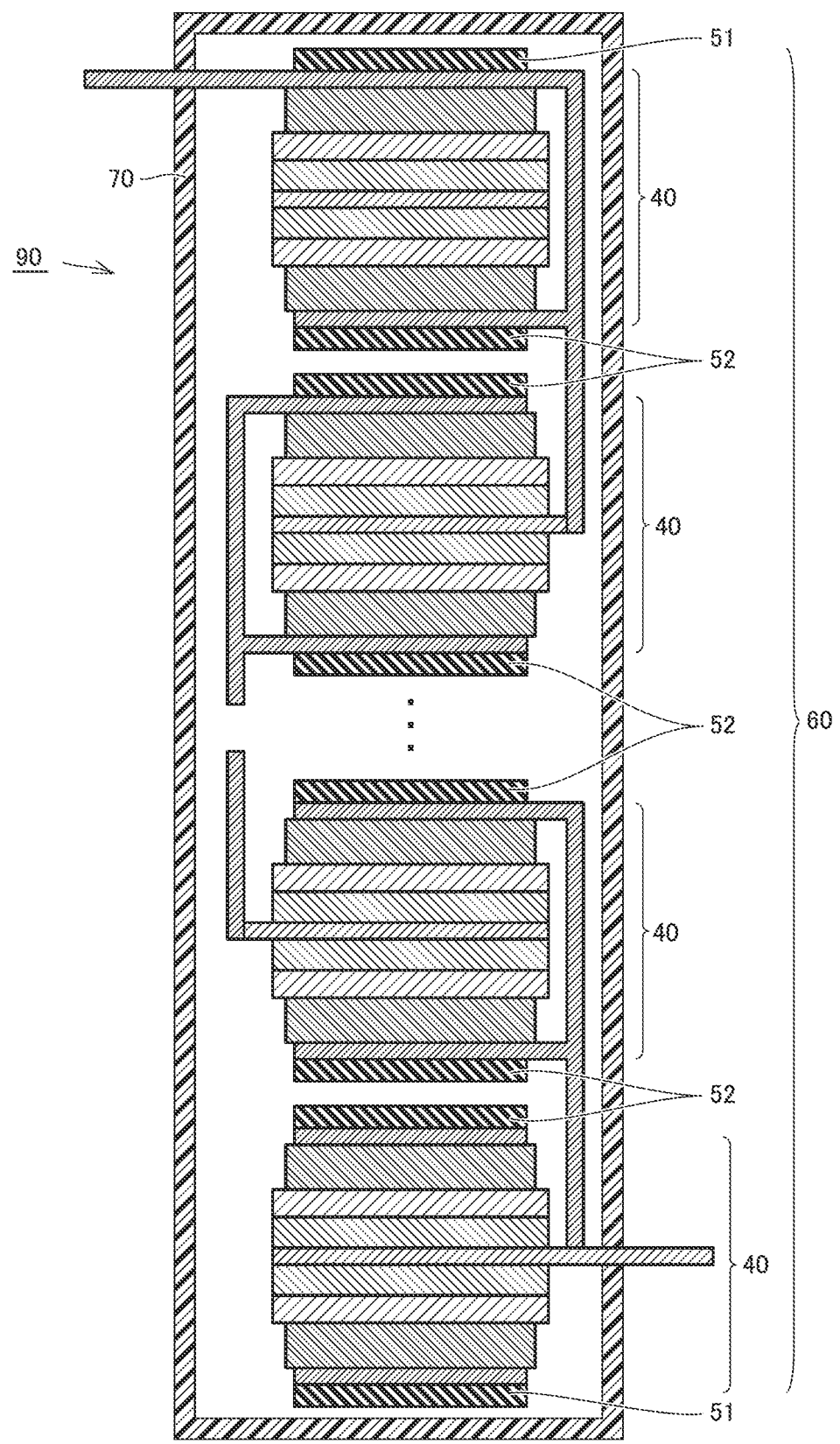
FIG. 4 is a schematic cross-sectional view illustrating an all-solid-state battery in which two insulating layer-attached stack units according to the present embodiment are disposed at both ends, and one or more stack units are sandwiched therebetween and separated by an insulating layer.

The electrode member 60 having the both ends may include at least two insulating layer-attached stack units disposed at the both ends thereof. The electrode member 60 having the both ends may further include one or more stack units 40 disposed between the two insulating layer-attached stack units at the both ends. The electrode member 60 may include, for example, a plurality of stack units 40. As illustrated in FIG. 3, the plurality of stack units 40 may be electrically connected in parallel, for example. As illustrated in FIG. 4, the plurality of stack units 40 may be electrically connected in series, for example.

<<(D) Accommodation>>

The method of producing an all-solid-state battery 90 according to the present embodiment includes accommodating the electrode member 60 in the case 70.

The case 70 accommodates the electrode member 60. The case 70 is sealed. The case 70 includes at least a metal material. The case 70 may be, for example, a pouch made of an aluminum (Al)-laminated film. The case 70 may be, for example, a metal case or the like.

<<(E) Assembly of Restraint Member>>

The method of producing an all-solid-state battery 90 according to the present embodiment includes assembling a restraint member (not shown) to the outside of the case 70 to produce the all-solid-state battery 90.

The restraint member is assembled to the outside of the case 70. The restraint member may apply to the insulating layer 51 a pressure that is less than the test pressure in the dielectric breakdown test. The pressure is transmitted to the electrode member 60 via the case 70.

The all-solid-state battery 90 may be used in an environment with a temperature that is equal to or lower than the test temperature in the dielectric breakdown test. Since the insulation inspection is performed in an environment severer than that during practical use of the all-solid-state battery 90, it is possible to reduce the possibility of short circuits during practical use.

EXAMPLES

Hereinafter, examples will be described. It should be noted that the scope of claims is not limited by the following examples.

<Production of all-Solid-State Battery>

Example 1

1. Formation of Positive Electrode Layer
The following materials were prepared:
positive electrode active material: $Li_{1.15}Ni_{1/3}Co_{1/3}Mn_{1/3}O_2/LiNbO_3$;
solid electrolyte: $LiI$—$LiBr$—$(Li_2S$—$P_2S_5)$ (glass ceramics);
conductive material: VGCF;
binder: PVdF;
dispersion medium: butyl acetate; and
temporary support: Al foil.

$LiNbO_3$ was coated on particles having $Li_{1.15}Ni_{1/3}Co_{1/3}Mn_{1/3}O_2$ as the main component under air atmosphere by using a tumbling fluid bed coater (manufactured by Powrex Corporation), and calcined under air atmosphere to prepare positive electrode active material particles having a coating layer of $LiNbO_3$.

PVdF, the positive electrode active material particles prepared above, $Li_2S$—$P_2S_5$-based glass ceramics, and VGCF (manufactured by Showa Denko) were added to a PP vessel and stirred for 30 seconds with an ultrasonic disperser (such as UH-50 manufactured by SMT Co., Ltd). Next, the PP vessel was shaken for 3 minutes with a shaker (such as TTM-1 manufactured by Shibata Scientific Technology Ltd), and then stirred for 30 seconds with the ultrasonic disperser. Thereafter, the PP vessel was shaken for 3 minutes with the shaker to prepare a slurry. A doctor blade applicator was used to coat the slurry on an Al foil. Thereafter, the slurry was air-dried, and further dried on a hot plate at 100° C. for 30 minutes. Thereby, a positive electrode layer 10 having a positive electrode composite material layer 12 coated on the Al foil was prepared.

2. Formation of Negative Electrode Layer

The following materials were prepared:
negative electrode active material: $Li_4Ti_5O_{12}$;
solid electrolyte: LiI—LiBr—($Li_2S$—$P_2S_5$) (glass ceramics):
conductive material: VGCF;
binder: PVdF;
dispersion medium: butyl acetate; and
negative electrode collector foil: Cu foil.

PVdF, $Li_4Ti_5O_{12}$ particles and $Li_2S$—$P_2S_5$-based glass ceramics were added to a PP vessel and stirred for 30 minutes with an ultrasonic disperser to prepare a slurry. A doctor blade applicator was used to coat the slurry on a Cu foil. Thereafter, the slurry was air-dried, and further dried on a hot plate at 100° C. for 30 minutes. Thereby, a negative electrode layer 20 having a negative electrode composite material layer 22 coated on the Cu foil was prepared. The back surface was coated and dried in the same manner.

3. Formation of Solid Electrolyte Layer

The following materials were prepared:
solid electrolyte: LiI—LiBr—($Li_2S$—$P_2S_5$) (glass ceramics);
binder: BR;
dispersion medium: heptane; and
temporary support: Al foil.

Heptane, BR and $Li_2S$—$P_2S_5$-based glass ceramics were added to a PP vessel and stirred for 30 seconds with an ultrasonic disperser. Next, the PP vessel was shaken for 30 minutes with a shaker (such as TTM-1 manufactured by Shibata Scientific Technology Ltd), and then stirred for 30 seconds with the ultrasonic disperser. Thereafter, the PP vessel was shaken for 3 minutes with the shaker to prepare a slurry. A doctor blade applicator was used to coat the slurry on an Al foil. Thereafter, the slurry was air-dried, and further dried on a hot plate at 100° C. for 30 minutes. Thereby, a solid electrolyte layer 30 was formed on the Al foil.

4. Formation of Carbon Layer-Coated Al Foil

The following materials were prepared:
conductive material: furnace black (25% by mass) and PVdF (75% by mass);
dispersion medium: N-methyl-2-pyrrolidone (NMP); and
positive electrode collector foil: Al foil Furnace black and PVdF were weighed at a ratio of 25 mass %:75 mass %. Thereafter, NMP was added to prepare a carbon paste. Next, the carbon paste was coated on one surface of the Al foil to a thickness of 2 m, and dried at 100° C. for 1 hour. Thereafter, the carbon layer-coated Al foil was cut into a size of 69.0 mm×91.0 mm (i.e., the size of the carbon layer is 69.0 mm×51.0 mm).

5. Formation of Insulating Layer-Integrated Collector Foil

A PP resin film having a thickness of 10 μm and a size of 69.0 mm×76.0 mm was bonded to the other surface of the carbon layer-coated Al foil prepared in the above step 4 where the carbon layer is not formed, and thereby, an insulating layer-integrated collector foil 53, which includes an insulating layer 51 and a carbon layer, was prepared.

6. Formation of Stack Unit

The negative electrode composite material layer 22 and the solid electrolyte layer 30 were bonded in direct contact with each other, pressed at 1.6 ton/cm, and then the Al foil which serves as the temporary support was peeled off. Next, the positive electrode composite material layer 12 and the solid electrolyte layer 30 were bonded in direct contact with each other and pressed at 1.6 ton/cm. The Al foil was peeled off, and the remainder was pressed to a thickness of 0.5 mm. Thereafter, the pressed body was trimmed and cut by laser in such a manner that the size of the positive electrode is 70.0 mm×70.0 mm and the size of the negative electrode is 72.0 mm×72.0 mm. BR was used to bond the carbon layer-coated Al foil to both surfaces of the negative electrode in a region separated by 2.0 mm from each end edge of the negative electrode, and thereby a stack unit 40 was prepared.

7. Formation of Insulating Layer-Attached Stack Unit

BR was used to bond the insulating layer-integrated collector foil 53 to one surface of the negative electrode and the carbon layer-coated Al foil without being formed with an insulating layer 51 to the other surface of the negative electrode in a region separated by 2.0 mm from each end edge of the negative electrode. Thereafter, the bonded body was restrained at 80° C. and 38 MPa, and it was confirmed that the reduction amount of film thickness of the insulating layer 51 was 0.6 μm. Thereafter, the dielectric resistance was measured to confirm that the insulation of the insulating layer-attached stack unit was not destroyed. The maximum reduction amount of film thickness in the present example was 0.58 μm.

8. Stacking

Two of the insulating layer-attached stack units prepared in the above step 7 were disposed at both ends in such a manner that the insulating layer 51 was in contact with the case 70, eight of the stack units 40 prepared in the above step 6 were stacked therebetween, and welded with terminals to prepare an electrode member 60.

9. Accommodation

A case 70 made of an Al-laminated film was prepared. The electrode member 60 prepared in the above step 8 was accommodated in the case 70, and thereafter, the case 70 was sealed.

10. Assembly of Restraint Member

A restraint member was assembled to the outside of the case 70. Thus, the all-solid-state battery 90 according to Example 1 was produced.

Examples 2 to 6 and Comparative Examples 1 to 3

An all-solid-state battery 90 according to each of Examples 3 to 6 was produced in the same manner as in Example 1 except that the maximum temperature, the restraint pressure, the maximum reduction amount of film thickness and the reduction amount of film thickness at each restraint pressure in the above step "7. Formation of insulating layer-attached stack unit" were changed as listed in the following Table 1.

Comparative Examples 4 and 5

An all-solid-state battery 90 according to each of Comparative Examples 4 and 5 was produced in the same manner as in Example 1 except that the insulating layer in the above step "5. Formation of insulating layer-integrated collector foil" was changed to PE resin, and the maximum temperature, the restraint pressure, the maximum reduction amount of film thickness and the reduction amount of film thickness at each restraint pressure in the above step "7. Formation of insulating layer-attached stack unit" were changed as listed in the following Table 1.

Comparative Examples 6 and 7

The step "5. Formation of insulating layer-integrated collector foil" was not performed. In addition, in above step "7. Formation of insulating layer-attached stack unit", a carbon layer-coated Al foil without being formed with an insulating layer 51 on both surfaces thereof was used. In Comparative Example 6, an all-solid-state battery 90 was produced in the same manner as in Example 1 except that no inspection was performed. In Comparative Example 7, an all-solid-state battery 90 was produced in the same manner as in Example 1 except that the maximum temperature, the restraint pressure, the maximum reduction amount of film thickness and the reduction amount of film thickness at each restraint pressure in the above step "7. Formation of insulating layer-attached stack unit" were changed as listed in the following Table 1.

Comparative Example 8

An all-solid-state battery 90 according to Comparative Example 8 was produced in the same manner as in Example 1 except that the maximum temperature, the restraint pressure, the maximum reduction amount of film thickness and the reduction amount of film thickness at each restraint pressure in the above step "7. Formation of insulating layer-attached stack unit" were changed as listed in the following Table 1, and that the two insulating layers 51 of the two insulating layer-attached stack units at both ends was disposed inside the electrode member 60 having the both ends without contacting the case 70 in the above step "8. Stacking".

Comparative Example 9

The above step "5. Formation of insulating layer-integrated collector foil" was not performed. In addition, in the above step "7. Formation of insulating layer-attached stack unit", a carbon layer-coated Al foil without being formed with an insulating layer 51 on both surfaces thereof was used, and no inspection was performed. Further, in the above step "8. Stacking", a urethane film having a thickness of 300 μm was disposed between the stack unit 40 and the case 70. An all-solid-state battery 90 was produced in the same manner as in Example 1 except for the changes mentioned above.

<<Evaluation>>

1. Restraint

Each all-solid-state battery 90 as produced in the above was restrained at the maximum restraint pressure in the settings for the electrode member as listed in the following Table 1.

2. Durability Evaluation

After restraining, each all-solid-state battery 90 was charged and discharged for five times. One cycle of charge and discharge represents a full round of "charge, rest, discharge (travel) and rest" as mentioned below.

Test temperature: 40° C.

Charge: CCCV mode, CC current=1 C, CV voltage=2.95 V

Rest: 10 hours

Discharge: CCCV mode, CC current=1 C, CV voltage=1.5 V

Rest: 10 hours

In the present embodiment, "CCCV mode" refers to "constant current-constant voltage mode"; "CC current" refers to the current during constant current charging (or during constant current discharging); "1 C" refers to a current rate at which a battery is charged to (or discharged from) the full charge capacity in 1 hour; and "CV voltage" refers to the voltage during constant voltage charging (or during constant voltage discharging).

In the test mentioned above, in Examples 1 to 3, Comparative Example 1, Comparative Example 2 and Comparative Examples 4 to 9, the temperature of the electrode member increased to a maximum of 80° C.; and in Examples 4 to 6 and Comparative Example 3, the electrode member was cooled, and thereby, the temperature thereof only increased to a maximum of 60° C.

3. Short-Circuit Inspection

The dielectric resistance of the positive electrode terminal and the Al-laminated film was measured to confirm whether or not the dielectric insulation is destroyed, and the rate of short-circuited products was calculated. Test conditions and results are listed in the following Table 1.

TABLE 1

| | Disposition of insulating layer | Insulating material | Thickness of insulating material (μm) | Settings for electrode member Maximum restraint pressure (MPa) | Maximum temperature (° C.) | Maximum reduction amount of film thickness (μm) | Test conditions Restraint pressure (MPa) | Temperature (° C.) | Reduction amount of Film thickness (μm) | Rate of short-circuited products (%) |
|---|---|---|---|---|---|---|---|---|---|---|
| Example 1 | insulating layer integrated with collector foil | PP | 10 | 20 | 80 | 0.58 | 38 | 80 | 0.6 | 0 |
| Example 2 | | | | 5 | | 0.47 | 21 | | 0.47 | |
| Example 3 | | | | 1 | | 0.39 | 11 | | 0.4 | |
| Example 4 | | | | 20 | 60 | 0.52 | 28 | 60 | 0.52 | |
| Example 5 | | | | 5 | | 0.4 | 13 | | 0.41 | |
| Example 6 | | | | 1 | | 0.33 | 3 | | 0.33 | |
| Comparative Example 1 | | | | 5 | 80 | 0.47 | 10 | 80 | 0.39 | 10 |
| Comparative Example 2 | | | | | | | 5 | | 0.35 | 20 |
| Comparative Example 3 | | | | | 60 | 0.4 | 10 | 60 | 0.39 | 5 |
| Comparative Example 4 | | PE | | 20 | 80 | no saturation | 38 | 80 | 0.7 | 10 |
| Comparative Example 5 | | | | 1 | | | 11 | | 0.45 | |
| Comparative Example 6 | no insulating | — | | 5 | | 0.47 | | not detected | | 30 |

TABLE 1-continued

| | | | Settings for electrode member | | Maximum | Test conditions | | | Rate of |
|---|---|---|---|---|---|---|---|---|---|
| | | Thickness of insulating material (μm) | Maximum restraint pressure (MPa) | Maximum temperature (°C) | amount of film thickness reduction (μm) | Restraint pressure (MPa) | Temperature (°C) | Reduction amount of Film thickness (μm) | short-circuited products (%) |
| Disposition of insulating layer | Insulating material | | | | | | | | |
| Comparative Example 7 | layer disposed | | | | | 5 | 80 | 0.31 | |
| Comparative Example 8 | insulating layer disposed inside | PP | | | | | | | |
| Comparative Example 9 | disposed between electrode member and case | urethane | 300 | 20 | | no saturation | | not detected | 25 |

<<Results>>

Examples 1 to 6

As listed in Table 1, in Examples 1 to 6, the rate of short-circuited products was 0%.

In Comparative Examples 1 to 9, the rate of short-circuited products was 5 to 30%, which was higher than that in Examples.

Although the embodiments of the present disclosure have been described as above, it should be understood that the embodiments disclosed herein are illustrative and non-restrictive in every respect. The scope of the present disclosure is defined by the terms of the claims, and is intended to include any modifications within the meaning and scope equivalent to the terms of the claims.

What is claimed is:

1. A method of producing an all-solid-state battery, comprising:

forming an insulating layer-attached stack unit including an insulating layer and a stack unit that includes a positive electrode layer, a solid electrolyte layer and a negative electrode layer;

performing a dielectric breakdown test on the insulating layer included in the insulating layer-attached stack unit, and determining that the insulating layer-attached stack unit is a non-defective product if no dielectric breakdown is present;

forming an electrode member having both ends by disposing two insulating layer-attached stack units at the both ends, the insulating layer-attached stack unit being determined to be a non-defective product;

accommodating the electrode member in a case; and assembling a restraint member to the outside of the case to produce the all-solid-state battery, in the dielectric breakdown test, the a presence or absence of dielectric breakdown being confirmed at a predetermined test temperature with a predetermined test pressure applied to the insulating layer, the predetermined test temperature is greater than or equal to a measured operation maximum temperature of the electrode member and the predetermined test pressure is greater than or equal to a measured maximum restraint pressure of the electrode member, under the test temperature and the test pressure of the dielectric breakdown test, the insulating layer having a property that the a thickness thereof is gradually reduced to a constant value, the insulating layer being disposed between the stack unit and the case, and the case including a metal material.

2. The method of producing an all-solid-state battery according to claim 1, wherein the restraint member applies to the insulating layer a pressure that is less than the test pressure in the dielectric breakdown test, and the all-solid-state battery is used in an environment with a temperature that is equal to or lower than the test temperature in the dielectric breakdown test.

3. The method of producing an all-solid-state battery according to claim 1, wherein the electrode member having the both ends further includes one or more stack units disposed between the two insulating layer-attached stack units at the both ends, and the insulating layer is disposed between adjacent stack units.

4. The method of producing an all-solid-state battery according to claim 1, wherein the insulating layer comprises one or more of polypropylene, diamond-like carbon, alumina, anodized aluminum, silicon carbide, and boron nitride.

* * * * *